US009953837B2

(12) United States Patent
Caubet et al.

(10) Patent No.: US 9,953,837 B2
(45) Date of Patent: Apr. 24, 2018

(54) TRANSISTOR HAVING A GATE COMPRISING A TITANIUM NITRIDE LAYER AND METHOD FOR DEPOSITING THIS LAYER

(71) Applicant: STMICROELECTRONICS (CROLLES 2) SAS, Crolles (FR)

(72) Inventors: Pierre Caubet, Le Versoud (FR); Sylvain Baudot, Odars (FR)

(73) Assignee: STMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 14/669,183

(22) Filed: Mar. 26, 2015

(65) Prior Publication Data

US 2015/0200099 A1    Jul. 16, 2015

Related U.S. Application Data

(62) Division of application No. 13/530,621, filed on Jun. 22, 2012, now Pat. No. 9,000,596.

(30) Foreign Application Priority Data

Jun. 30, 2011    (FR) ...................................... 11 55917

(51) Int. Cl.
*H01L 21/28* (2006.01)
*H01L 29/49* (2006.01)
*H01L 21/285* (2006.01)

(52) U.S. Cl.
CPC .. *H01L 21/28088* (2013.01); *H01L 21/28158* (2013.01); *H01L 21/28556* (2013.01); *H01L 29/4966* (2013.01)

(58) Field of Classification Search
CPC ....... H01L 21/823842; H01L 23/53223; H01L 21/28088
See application file for complete search history.

(56) References Cited

U.S. PATENT DOCUMENTS

| 5,804,878 | A | * | 9/1998 | Miyazaki | .............. H01L 27/124 257/354 |
| 5,961,791 | A | * | 10/1999 | Frisa | ................... C23C 14/0641 204/192.1 |
| 6,005,277 | A | | 12/1999 | Liu et al. | |
| 6,057,603 | A | | 5/2000 | Dawson | |

(Continued)

FOREIGN PATENT DOCUMENTS

EP    0697714    2/1996

OTHER PUBLICATIONS

Baudot et al., "Comparison of radio frequency physical vapor deposition target material used for LaOx cap layer deposition in 32mm MOSFETs", Microelectronic Engineering, vol. 88, May 2011, pp. 569-572.

(Continued)

*Primary Examiner* — Marc Armand
(74) *Attorney, Agent, or Firm* — Seed IP Law Group LLP

(57) ABSTRACT

A MOS transistor having a gate insulator including a dielectric of high permittivity and a conductive layer including a TiN layer, wherein the nitrogen composition in the TiN layer is sub-stoichiometric in its lower portion and progressively increases to a stoichiometric composition in its upper portion.

19 Claims, 2 Drawing Sheets

(56) References Cited

U.S. PATENT DOCUMENTS

| | | | |
|---|---|---|---|
| 6,241,859 B1* | 6/2001 | Yamada | H01L 21/28052 204/192.15 |
| 6,395,629 B1* | 5/2002 | Sidhwa | H01L 21/32051 257/E21.295 |
| 6,545,356 B2 | 4/2003 | Akram et al. | |
| 7,727,882 B1 | 6/2010 | Wu et al. | |
| 7,935,242 B2 | 5/2011 | Klein et al. | |
| 2002/0050644 A1* | 5/2002 | Matsumoto | H01L 21/28061 257/751 |
| 2004/0106249 A1 | 6/2004 | Hannu | |
| 2005/0167767 A1* | 8/2005 | Akasaka | H01L 21/28088 257/410 |
| 2006/0105515 A1 | 5/2006 | Amos et al. | |
| 2010/0140079 A1* | 6/2010 | Chou | G01N 27/414 204/192.25 |
| 2010/0155860 A1 | 6/2010 | Colombo et al. | |
| 2010/0224939 A1 | 9/2010 | Kim et al. | |
| 2011/0215409 A1* | 9/2011 | Li | H01L 21/28088 257/351 |
| 2011/0284971 A1 | 11/2011 | Sakashita et al. | |
| 2011/0309455 A1 | 12/2011 | Ando et al. | |

OTHER PUBLICATIONS

Baudet et al., "Understanding reversal effects of metallic aluminum introduced in HfSiON/TiN PMOSFETs", Microelectronic Engineering, vol. 88, 2011, pp. 1305-1308.

Ellwanger et al., "The deposition and film properties of reactively sputtered titanium nitride", Thin Solid Films, vol. 161, Jul. 1988, pp. 289-304.

Kim et al., "Effect of Ti-rich TiN as a co-salicide capping layer for 0.15 um embedded flash memory devices and beyond", Thin Solid Films, vol. 504, No. 102, May 2006, pp. 20-24.

Wu et al., "Invesitgation of ALD or PVD (Ti-rich vs. N-rich) TiN metal gate thermal stability of Hfo2 high-K", VLSI-TSA, International Symposium on IEEE, Apr. 2010, pp. 90-91.

Zlatanovic et al., "Opticall properties of TiN thin films for microelectronic applications", Microelectronics Proceedings, 21st International Conference on NIS, Sep. 1997, pp. 205-208.

* cited by examiner

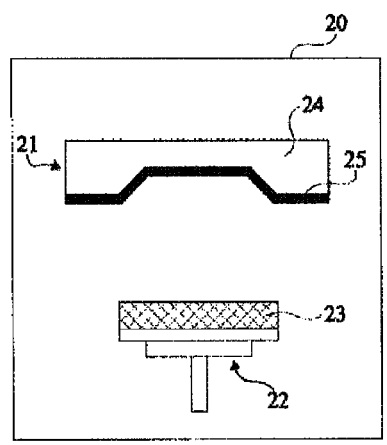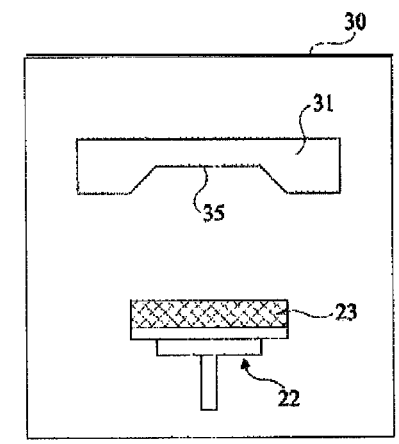
Fig 2                                Fig 4
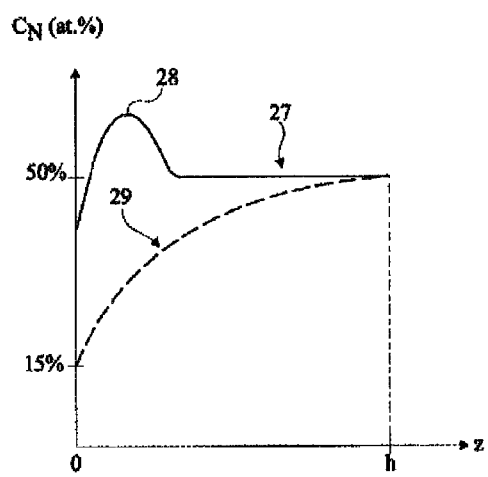
Fig 3

TRANSISTOR HAVING A GATE COMPRISING A TITANIUM NITRIDE LAYER AND METHOD FOR DEPOSITING THIS LAYER

BACKGROUND OF THE INVENTION

Field of the Invention

The present invention relates to MOS transistors having a gate insulator comprising a dielectric of high permittivity and having a conductive gate comprising a titanium nitride layer (TiN). The present invention also relates to methods for depositing TiN layers.

Discussion of prior art

FIGS. 1A and 1B are a simplified cross-section view of a portion of a silicon wafer 1 on which a gate 2 of an N-channel MOS transistor and a gate 3 of a P-channel MOS transistor have been formed. Such gate structures are described in S. Baudot et al., "Comparison of radio frequency physical vapor deposition target material used for $LaO_x$ cap layer deposition in 32 nm NMOSFETs", Microelectronic Engineering, volume 88, pages 569-572, 2011 and in S. Baudot et al., "Understanding reversal effects of metallic aluminium introduced in HfSiON/TiN PMOS-FETS", Microelectronic Engineering, 2011.

In silicon wafer 1, a specific region, for example, an N-doped well 4, has been formed on the side of the P-channel MOS transistor.

The gate insulator of the N-channel and P-channel transistors comprises a dielectric layer 5, for example, nitrided silicon oxide, SiON, and a dielectric layer of high permittivity 6, for example, a layer of a hafnium-based material, for example HfSiON or $HfO_2$.

Gate 2 of the N-channel transistor is formed of a very thin lanthanum layer 7, covered with a main TiN layer 8, itself coated with a polysilicon layer 9.

Gate 3 of the P-channel transistor further comprises, between layer 6 and layer 7, a first auxiliary TiN layer 10, an aluminum layer 11, and a second auxiliary TiN layer 12, to adjust the threshold voltage of the P-channel transistor with respect to that of the N-channel transistor.

As an example, for a transistor having a 28-nm gate length, the thickness of lanthanum layer 7 may be 0.4 nm, that of TiN layer 8 may be 6.5 nm, and that of polysilicon layer 9 may be 50 nm. The thickness of TiN layer 10 may be 1 nm, that of aluminum layer 11 may be 0.22 nm, and that of TiN layer 12 may be 2.5 nm.

It can be observed that transistors provided with a gate insulator and with a gate such as described hereabove have relatively high gate leakage currents. It can also be observed that the lifetime of such transistors is limited.

Thus, there is a need for transistors having a gate structure similar to that described in relation with FIGS. 1A and 1B but having a lower gate leakage current and a longer lifetime.

SUMMARY OF THE INVENTION

A feature of an embodiment is to decrease the gate leakage currents of MOS transistors having their gate insulator comprising a dielectric of high permittivity and having their conductive gate comprising a titanium nitride layer.

Another feature of an embodiment is to increase the lifetime of such transistors.

To achieve these features, the applicants have studied the origin of gate leakage currents of transistors of the above-described type. These studies have resulted in imputing the high gate leakage currents to the composition of the main TiN layers.

Thus, the applicants provide, for the main TiN layers, a specific composition as well as a method for obtaining these layers.

An embodiment provides a MOS transistor having a gate insulator comprising a dielectric of high permittivity and a conductive layer comprising a TiN layer, wherein the nitrogen composition in the TiN layer is sub-stoichiometric in its lower portion and progressively increases to a stoichiometric composition in its upper portion.

According to an embodiment, the conductive gate of an N-channel transistor comprises a lanthanum layer covered with said TiN layer.

According to an embodiment, the conductive gate of a P-channel transistor successively comprises a first auxiliary TiN layer, an aluminum layer, a second auxiliary TiN layer, a lanthanum layer, and said TiN layer, the nitrogen composition in the auxiliary TiN layers being sub-stoichiometric in their lower portion and progressively increasing to a stoichiometric composition in their upper portion.

According to an embodiment, the thickness of said TiN layer ranges between 5 and 10 nanometers.

According to an embodiment, the thickness of the lanthanum layer ranges between 0.2 and 0.6 nanometer.

According to an embodiment, the thicknesses of the auxiliary TiN layers range between 1 and 3 nanometers, and the thickness of the aluminum layer is smaller than 1 nanometer.

According to an embodiment, the dielectric of high permittivity is a hafnium-based material.

According to an embodiment, the dielectric of high permittivity is selected from the group comprising HfSiON and $HfO_2$.

According to an embodiment, the dielectric, of high permittivity comprises a layer of a hafnium-based material on a SiON layer.

An embodiment provides a method for depositing, by reactive cathode sputtering on a titanium target, a TiN layer of a gate conductor of a MOS transistor, comprising the steps of: before each deposition on a wafer, denitriding the target; and forming a deposition on the wafer by creating an argon and nitrogen plasma capable of bombarding the target, the nitrogen proportion in the plasma being from two to three times greater than the argon proportion.

According to an embodiment, the deposition step is carried out with an argon flow rate ranging from 10 to 25 $cm^3_n$/min, a nitrogen flow rate from two to three times greater than the argon flow rate, and a pressure ranging between 1 and 3 millitorrs.

The foregoing and other features and benefits will be discussed in detail in the following non-limiting description of specific embodiments in connection with the accompanying drawings.

BRIEF DESCRIPTION OF THE DRAWINGS

FIG. 2 shows a sputtering chamber used to deposit a TiN layer;

FIG. 3 shows profiles of the nitrogen concentration across the thickness of a TiN layer; and FIG. 4 shows a sputtering chamber used to deposit a TiN layer.

For clarity, the same elements have been designated with the same reference numerals in the different drawings and, further, as usual in the representation of semiconductor components, FIGS. 1A and 1B are not drawn to scale.

DETAILED DESCRIPTION

Figure 1A:
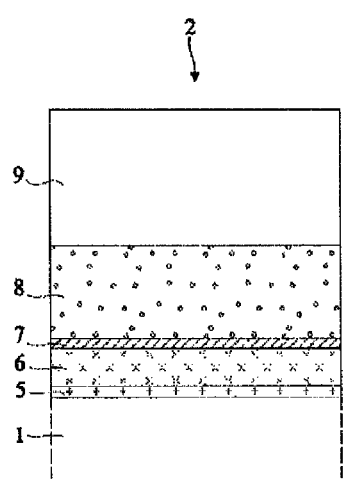
FIGS. 1A and 1B, previously described, are a simplified cross-section view of a silicon wafer portion on which a gate of an N-channel MOS transistor and a gate of a P-channel MOS transistor have been formed.
Figure 1B:
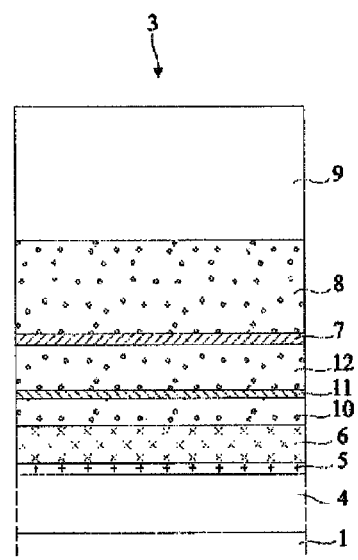

Main TiN layers 8 of gate structures such as described in relation with FIGS. 1A and 1B are currently formed by reactive cathode sputtering, also called physical vapor deposition (PVD), and more specifically by RF-PVD.

A reactive cathode sputtering chamber used to implement a conventional method of deposition of a TiN layer is illustrated in FIG. 2. Chamber 20 contains a target 21 and a support 22 on which is arranged a wafer 23 on which a TiN layer is desired to be deposited.

Target 21 is a titanium block 24, having an apparent surface nitrided on the wafer side, that is, comprising a TiN layer 25 on this side.

Before the placing of wafer 23 on its support 22 in chamber 20, an argon and nitrogen plasma RF is created in chamber 20. This plasma enables to form TiN layer 25 of target 21 with the desired composition for the TiN layer which is desired to be deposited on wafer 23.

Once the target has been nitrided, after having arranged wafer 23 on support 22, an RF argon and nitrogen plasma is created in chamber 20, the two gases being in proportions identical to those used to form TiN layer 25 of target 21. Ions from the plasma bombard TiN surface 25 of target 21. As a result, TiN agglomerates are torn off from the surface of the target and are projected into the chamber, especially towards the wafer surface.

As an example, the argon and nitrogen flow rates in the chamber are 20 $cm^3_n$/min, index n indicating that the measurement corresponds to normal temperature and pressure conditions, the pressure in the chamber being at a few millitorrs, the continuous power of the plasma is 500 watts, and the RF power is 600 watts.

The profile 27 of nitrogen concentration $C_N$ according to the thickness of a TiN layer deposited on a wafer by the above-described method is shown in FIG. 3. Value z=0 corresponds to the lower surface of the TiN layer and value z=h corresponds to its upper surface, h being the thickness of the TiN layer, from 5 to 10 nm, for example, 6.5 nm. The nitrogen concentration in a TiN layer deposited by the above-described method is substantially uniform across its entire thickness. The formed TiN is stoichiometric in most of the layer. There however is a nitrogen concentration peak 28 at the bottom of the layer. In a portion close to the lower surface of the TiN layer, the nitrogen composition is thus over-stoichiometric.

The applicants mainly impute the gate leakage currents in transistors comprising a gate insulator and a gate such as described in relation with FIGS. 1A and 1B to nitrogen concentration profile 27 in TiN layer 8.

To decrease such gate leakage currents, it is provided to form TiN layers with nitrogen concentration profiles 29 such as shown in FIG. 3. A sub-stoichiometric nitrogen composition in the lower portion of the TiN layer progressively increasing to reach a stoichiometric composition in its upper portion, is provided.

To achieve the type of profile corresponding to curve 29, a reactive cathode sputtering deposition method such as described hereinafter may be used.

Reactive cathode sputtering chamber 30 used to implement such a method is illustrated in FIG. 4. Target 31 is not covered with TiN, but is made of pure titanium.

Before placing wafer 23 on its support 22 in chamber 30, instead of nitriding the apparent surface of target 31 on the wafer side, a denitriding of this surface is performed to obtain a pure titanium bombarded surface 35. Such a denitriding is obtained by creating an argon plasma in chamber 30, to sputter the surface layer present on target 31 to expose its pure titanium substrate.

Wafer 23 is then introduced into chamber 30 and an RF argon and nitrogen plasma, capable of bombarding surface 35 of pure titanium target 31, is created. The nitrogen proportion in the plasma is from 2 to 3 times greater than the argon proportion.

As an example, an argon flow rate ranging from 10 to 25 $cm^3_n$/min and a nitrogen flow rate from two to three times greater are provided in the chamber, the pressure in the chamber being of a few millitorrs, for example, ranging between 1 and 3 millitorrs.

Plasma ions, by bombarding pure titanium surface 35 of target 31, tear off titanium agglomerates. The latter, projected into the chamber, combine with nitrogen present in the plasma before depositing. At the beginning, since the target is pure titanium, the nitrogen proportion combining with the titanium agglomerates is relatively low. Progressively, the target surface nitrides. TiN agglomerates are thus torn off from the target surface, and are projected into the chamber, especially towards the wafer surface, after having possibly combined with the plasma nitrogen. The TiN layer deposited on the wafer thus progressively enriches with nitrogen as it forms. A nitrogen concentration profile in the TiN layer of the type of profile 29 shown in FIG. 3 is obtained.

The continuous power of the plasma is preferably greater than that of a conventional method, which enables to decrease the wafer processing time. As an example, the continuous power may range between 650 and 800 watts for a 600-watt RF power of the plasma.

After the deposition of a TiN layer on a wafer, the surface of target 31 is denitrided, to have again a pure titanium bombarded surface 35 for the deposition of a TiN layer on another wafer.

It should be noted that auxiliary TiN layers 10 and 12 of gate structures such as described in relation with FIGS. 1A and 1B may be formed by a method such as described hereabove.

The applicants have performed a number of gate leakage current measurements in transistors having a gate structure such as described in relation with FIGS. 1A and 1B.

In the case of main TiN layer 8 and auxiliary TiN layers 10 and 12 obtained by a conventional sputtering method such as described in relation with 2, the surface gate leakage currents, $I_g$/WL, with W standing for the gate width and L for the gate length of the transistors, are approximately 0.1888 A/$cm^2$ for N-channel MOS transistors and approximately 0.0409 A/$cm^2$ for P-channel MOS transistors, for W=L=10 μm.

In the case of main TiN layer 8 and auxiliary TiN layers 10 and 12 of same thickness, obtained by a sputtering method such as described in relation with FIG. 4, providing the profile type corresponding to curve 29 of FIG. 3, surface gate leakage currents $I_g$/WL are approximately 0.0939 A/$cm^2$ for N-channel MOS transistors and approximately 0.018 A/$cm^2$ for P-channel MOS transistors, for W=L=10 μm.

The measured values of surface gate leakage currents $I_g/WL$ of N-channel and P-channel MOS transistors are summarized in the following table, for TiN layers obtained by a conventional sputtering method or by a method such as described in relation with FIG. 4, for W=L=10 μm and for W=L=5 μm.

|  | Conventional method | | Method such as described in relation with FIG. 4 | |
| --- | --- | --- | --- | --- |
|  | N channel | P channel | N channel | P channel |
| $I_g/WL$ (A/cm²) for W = L = 10 μm | 0.1888 | 0.0409 | 0.0939 | 0.0180 |
| $I_g/WL$ (A/cm²) for W = L = 5 μm | 0.4 | 0.45 | 0.15 | 0.35 |

The gate leakage currents of N-channel MOS transistors provided with a main TiN layer 8 having a profile corresponding to curve 29 are thus decreased by a factor ranging from 2 to 3 with respect to gate leakage currents of similar transistors with a main TiN layer 8 of same thickness obtained by a conventional sputtering method. The gate leakage currents of P-channel MOS transistors are approximately divided by 2.

Further, the applicants have carried out reliability measurements to assess the lifetime of transistors having a gate structure such as described in relation with FIGS. 1A and 1B. The reliability measurements which have been performed are time dependent dielectric breakdown measurements (TDDB) and negative bias temperature instability measurements (NBTI) for P-channel MOS transistors. This type of reliability measurements is discussed in W. Kanert et al., "Reliability aspects of semiconductor devices in high temperature applications", Microelectronics Reliability, 43, 9-11, pages 1839-46, 2003.

The lifetime deduced from the TDDB and NBTI reliability measurements of N-channel and P-channel MOS transistors provided with a main TiN layer 8 and auxiliary layers 10 and 12 having a profile corresponding to curve 29 and obtained by a sputtering method such as described in relation with FIG. 4, is increased by a factor 2 to 4 with respect to similar transistors having a main TiN layer 8 and auxiliary TiN layers 10 and 12 of same thickness, but obtained by a conventional sputtering method such as described in relation with FIG. 2.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for making a MOS transistor comprising:
   forming a gate insulator comprising a dielectric of high permittivity; and
   forming a conductive gate layer on the gate insulator and successively comprising
   a first auxiliary TiN layer,
   an aluminum layer on the first auxiliary TiN layer,
   a second auxiliary TiN layer on the aluminum layer,
   a lanthanum layer on the second auxiliary TiN layer, and
   a TiN layer on the lanthanum layer,
   with a nitrogen composition in each of the first and second auxiliary TiN layers and the TiN layer being sub-stoichiometric in a lower portion of each respective layer and progressively increasing to a stoichiometric composition in an upper portion of each respective layer.

2. The method of claim 1, wherein a thickness of the TiN layer is between 5 and 10 nanometers.

3. The method of claim 1, wherein a thickness of the lanthanum layer is between 0.2 and 0.6 nanometer.

4. The method of claim 1, wherein a thickness of each of the first and second auxiliary TiN layers is between 1 and 3 nanometers, and the thickness of the aluminum layer is smaller than 1 nanometer.

5. The method of claim 1, wherein the dielectric of high permittivity comprises a hafnium-based material.

6. The method of claim 1, wherein the dielectric of high permittivity comprises at least one of HfSiON and $HfO_2$.

7. The method of claim 1, wherein the dielectric of high permittivity comprises a hafnium-based material layer on a SiON layer.

8. A method for depositing a TiN layer for a gate conductor of a MOS transistor, comprising:
   denitriding a titanium target; and
   after denitriding the titanium target, depositing the TiN layer on the wafer by creating an inert gas and nitrogen plasma by bombarding the titanium target, with the nitrogen proportion in the plasma being less than three times the inert gas proportion, and the depositing comprising depositing so that a nitrogen composition in the TiN layer is sub-stoichiometric in a lower portion and progressively increasing to a stoichiometric composition in an upper portion.

9. The method of claim 8, wherein the nitrogen proportion in the plasma is less than three times an argon proportion.

10. The method of claim 8, wherein the inert gas comprises argon.

11. The method of claim 8, wherein depositing is carried out with a pressure ranging between 1 and 3 millitorr.

12. The method of claim 10, wherein depositing is carried out with an argon flow rate ranging from 10 to 25 cm³/min.

13. A method, comprising:
   denitriding a titanium target; and
   after denitriding the titanium target, depositing a TiN layer for a gate conductor of a MOS transistor on a wafer by creating an inert gas and nitrogen plasma by bombarding a titanium target, the plasma having a nitrogen proportion of less than three times an inert gas proportion, the inert gas comprising argon and the depositing being carried out with an argon flow rate ranging from 10 to 25 cm³/min, the TiN layer having a nitrogen composition that increases from a lower portion to an upper portion of the TiN layer.

14. The method of claim 13, wherein the nitrogen composition in the TiN layer is sub-stoichiometric in the lower portion and progressively increases to a stoichiometric composition in the upper portion.

15. The method of claim 13, wherein depositing is carried out with a pressure ranging between 1 and 3 millitorr.

16. A method, comprising:
   denitriding a titanium target; and
   after denitriding the titanium target, depositing a TiN layer for a gate conductor of a MOS transistor on a wafer by creating an inert gas and nitrogen plasma by bombarding a titanium target, the plasma having a nitrogen proportion of less than three times an inert gas proportion, the depositing being carried out with a pressure ranging between 1 and 3 millitorr, the TiN layer having a nitrogen composition that increases from a lower portion to an upper portion of the TiN layer.

17. The method of claim 16, wherein the nitrogen composition in the TiN layer is sub-stoichiometric in the lower portion and progressively increases to a stoichiometric composition in the upper portion.

18. The method of claim 16, wherein the inert gas comprises argon.

19. The method of claim 18, wherein depositing is carried out with an argon flow rate ranging from 10 to 25 cm$^3$/min.

* * * * *